(12) United States Patent
Edo et al.

(10) Patent No.: US 7,489,222 B2
(45) Date of Patent: Feb. 10, 2009

(54) MICROMINIATURE POWER CONVERTER AND THIN FILM MAGNETIC INDUCTION DEVICE THEREOF

(75) Inventors: Masaharu Edo, Tokorozawa (JP); Takayuki Hirose, Sagamihara (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/952,986

(22) Filed: Dec. 7, 2007

(65) Prior Publication Data
US 2008/0136575 A1 Jun. 12, 2008

(30) Foreign Application Priority Data
Dec. 7, 2006 (JP) ............................. 2006-330786

(51) Int. Cl.
H01F 5/00 (2006.01)
(52) U.S. Cl. ..................................................... 336/200
(58) Field of Classification Search ................... 336/65, 336/83, 192, 200, 206–208, 232
See application file for complete search history.

(56) References Cited
U.S. PATENT DOCUMENTS
6,930,584 B2    8/2005    Edo et al.
7,268,659 B2 *  9/2007    Nishio et al. ................ 336/200
2006/0227518 A1 10/2006   Nishio et al.

FOREIGN PATENT DOCUMENTS
| JP | 2001-196542 A | 7/2001 |
| JP | 2002-233140 A | 8/2002 |
| JP | 2004-274004 A | 9/2004 |
| JP | 2006-280127 A | 10/2006 |

* cited by examiner

Primary Examiner—Tuyen T. Nguyen
(74) Attorney, Agent, or Firm—Rossi, Kimms & McDowell, LLP

(57) ABSTRACT

A microminiature power converter includes a thin film magnetic induction device including a ferrite substrate and a solenoid coil conductor extending along the first and second principal planes of the substrate with the conductor extending through through-holes formed in the substrate to form a coil configuration. Electrodes are positioned near the peripheral region of the substrate and are collectively arranged at least one along the direction parallel to the axis of the solenoid coil formed by the conductor. The length of the coil can be increased to increase the inductance value of the coil. Gaps or grooves are provided near or in the peripheral region of the ferrite substrate to reduce induced voltage appearing in the electrodes.

20 Claims, 11 Drawing Sheets

Length of a gap with a slit shape

Length of a gap with a slit shape

First principal plane

Second principal plane

Coil width direction

Coil axis direction

MICROMINIATURE POWER CONVERTER AND THIN FILM MAGNETIC INDUCTION DEVICE THEREOF

BACKGROUND

Electronic information devices, particularly various types of mobile electronic information equipment, have become highly popular. Most of those types of electronic information equipment use batteries and contain a power converter, such as a DC-DC converter. The power converter is generally constructed as a hybrid power supply module in which discrete parts of active components, such as switching elements, rectifiers, and control ICs, and passive components, such as magnetic parts, capacitors, and resistors, are packaged on a ceramic board or a plastic printed circuit board.

With a requirement for reduction in size, thickness, and weight of various types of electronic information equipment, including the mobile devices, the built-in power converters need to be smaller and lighter. The miniaturization of the hybrid power module has been developed by an MCM (multi chip module) technique and a technique of laminated ceramic parts. Since discrete parts are packaged arranging on the same substrate, however, the reduction in packaging area of the power module is restricted. Particularly, a magnetic part, such as an inductor or a transformer, takes up a significant amount of volume in comparison with an integrated circuit. Accordingly, the magnetic part plays the most critical role in the final size and thickness of the electronic equipment.

To reduce the size and thickness of a magnetic component, two approaches are conceivable. One approach is to make the magnetic component as small and thin as possible, and package it on a planar board. Another approach is to make the magnetic component with a thin film and mount it on a silicon substrate. An example has been reported recently in which a thin micro magnetic element (coil, transformer) is mounted on a semiconductor substrate by applying a semiconductor technology. In particular, Japanese Unexamined Patent Application Publication No. 2001-196542, discloses a planar magnetic component (a thin inductor, a thin film magnetic induction device) formed using a thin film technology, where a thin film coil is sandwiched between a magnetic substrate and a ferrite substrate, and formed on a surface of a semiconductor substrate where semiconductor parts, such as a switching element and a control circuit, are formed. By such structure, it has become possible to reduce the thickness and the packaging area of the magnetic element. Forming such structure, however, requires a vacuum process, thus raising the manufacturing cost. In addition, it needs to laminate a multiple of magnetic films and insulator films for use at high electric current, which increases the costs very much.

Japanese Unexamined Patent Application Publication No. 2002-233140 (FIG. 1) discloses a type of a planar magnetic element, where a resin mixed with magnetic fine particles is filled in a gap of a spiral coil conductor, and sandwiched between ferrite substrates. In this approach, however, since the inductance of the coil conductor is approximately proportional to the number of turns of the spiral, it is necessary to increase the number of turns to achieve a large inductance. When the number of turns is increased without increasing the packaging area, the cross-sectional area of the coil conductor must be decreased. That is, to obtain a large inductance, it is necessary to decrease the cross-section of the coil conductor and to elongate the conductor wire. The decreased cross-sectional area of the coil conductor and the elongated conductor wire bring about an increase in the DC resistance of the coil conductor and an increase in power loss.

To solve this problem, Japanese Unexamined Patent Application Publication No. 2004-274004 (corresponds U.S. Pat. No. 6,930,584 B2, the disclosure of which is incorporated herein by reference, and Chinese Patent Application Publication No. CN 1525631 A1) discloses a thin magnetic element that comprises a magnetic insulating substrate, and a solenoid coil in which a first coil conductor formed on a first principal plane of the magnetic insulating substrate, a second coil conductor formed on a second principal plane of the magnetic insulating substrate, and a connection conductor formed in a through-hole passing through the magnetic insulating substrate are connected. Such structure provides a microminiature, thin power converter in which semiconductor elements and terminals for connection to a circuit board can be formed at the same time in the process for forming the through-holes and the coil conductor on the magnetic insulating substrate, and the IC chip only needs to be mounted on the magnetic insulating substrate for forming the solenoid coil, eliminating necessity for a separate packaging substrate.

Such microminiature power converter incorporates the through-hole formed in the magnetic insulating substrate, the coil conductors electrically connected through the through-hole and formed on the first principal plane and the second principal plane, and further an electrode (connection terminal) formed on the first principal plane for electrical connection to the semiconductor element, and another electrode (packaging terminal) formed on the second principal plane for electrical connection to a printed circuit board that is used in actual operation. The proposed constitution provides a power converter that achieves miniaturization and reduction in thickness while limiting the number of parts composing the converter to a minimum.

It has been reported in Japanese Unexamined Patent Application Publication No. 2006-280127 (corresponds to United States Patent Application Publication No. 2006/227518 A1 and Chinese Patent Application Publication No. CN 1841901 A1) that a malfunction hardly occurs when the terminals (electrodes) formed in the peripheral region of the ferrite substrate are arranged along the direction of Y-axis perpendicular to the axial direction (X-axis direction) of the solenoid coil, the magnetic flux density being low in the peripheral region along the Y-direction.

The structures disclosed in the above identified references have, as shown in FIGS. 11A and 11B, bonding electrodes (electrode 82 on the second principal plane and electrode 88 on the first principal plane) in the peripheral region of the thin film magnetic induction device for bonding with a semiconductor element (IC chip 80). Since the coil of the thin film magnetic induction device having a configuration of solenoid coil must be located in the central region of the ferrite substrate 86, the bonding electrodes (electrodes 82, 88) for bonding with the IC chip 80 are necessarily located in the peripheral region of the ferrite substrate 86. When the electrodes are arranged in the side region in the direction parallel to the coil width direction as in the case of FIGS. 11A and 11B where the electrodes 82, 88 are arranged along the four peripheral sides, the length and the number of turns of the coil are restricted by electrodes A arranged in the direction parallel to the coil width direction.

Among the characteristics of a thin film magnetic induction device, an inductance value largely depends on the length in the direction of the coil axis (size of the element). The size of the element primarily affects performance. The size of the semiconductor element (IC chip 80), on the other hand, can be restricted by the performance. There is no intrinsic correlation between the size of the semiconductor element and the size of a thin film magnetic induction device. Nevertheless, since the semiconductor element is mounted on the magnetic induction device and electrodes are arranged in the peripheral region, the size of the semiconductor element is eventually restricted by a size of the magnetic induction device.

Even though the semiconductor element can be minimized, if a thin film magnetic induction device is not minimized, the semiconductor element must have a large size, inhibiting reduction in the overall size. When the thin film magnetic induction device is minimized in correspondence with the reduced size of the semiconductor element, the performance of the magnetic induction device becomes worse, resulting in degraded efficiency of the power converter. Moreover, a large induced voltage is generated on the electrodes (a voltage generated by an action of magnetic field of the coil on the connection conductor of the electrodes), which is apt to bring about malfunctions of the semiconductor element (an IC).

In FIGS. 11A and 11B, reference 81 designates a stud bump connecting the IC chip 80 and the electrode 88, references 83 and 85 designate through holes accommodating connection conductors that connect front and back electrodes and front and back coil conductors, reference 87 designates a protective film for protecting the coil; and numeral 89 designates an under fill resin.

There remains a need for a microminiature power converter with its thin film magnetic induction device having a higher inductance value, while reducing induced voltage appearing at its electrodes. The present invention addresses this need.

SUMMARY OF THE INVENTION

The present invention relates to a microminiature power converter, such as a DC-DC converter, and a thin film magnetic induction device. The present invention also relates to a method of manufacturing the same.

One aspect of the present invention is the microminiature power converter. The power converter includes a semiconductor device having an integrated circuit, and a thin film magnetic induction device operatively connected to the semiconductor device. The thin film magnetic induction device includes a magnetic insulating substrate having a first principal plane and a second principal plane, a plurality of first through-holes, and a plurality of second through-holes. The induction device further includes a solenoid coil comprising a conductor extending on the first principal plane of the magnetic insulating substrate, passing through the through holes and extending on the second principal plane of the magnetic insulating substrate to form a coil configuration. Second connection conductors are in the second through-holes. A plurality of pairs of electrodes are connected through the second connection conductors and formed opposing each other on the first principal plane and the second principal plane. The second through-holes are situated along a peripheral region of the magnetic insulating substrate.

In one aspect, the pairs of electrodes are arranged collectively at only at one side or two opposing sides of the magnetic insulating substrate, extending parallel to an axis of the solenoid coil.

In another aspect, the magnetic insulating substrate has at least one of gaps or grooves around the peripheral region thereof to reduce induced voltage between the pairs of electrodes. The gaps can extend from the second through-holes or can be spaced from the second through-holes. Each of the gaps can have a slit configuration passing through the magnetic insulating substrate. The grooves can extend between adjacent pairs of the electrodes on the first or second principal plane. The grooves can extend from at least one the first or the second principal plane toward but not to the other of the first or second plane. The gaps or grooves can reach an outer peripheral end of the magnetic insulating substrate.

Another aspect of the present invention is the thin film magnetic induction device defined above.

Another aspect of the present invention is a method of manufacturing the thin film magnetic induction device defined above. The method can include forming a first conductor on the first principal plane and a second conductor on the second principal plane, and forming a first connection conductor in the first through-holes to connect the first and second conductors to form the coil.

BRIEF DESCRIPTION OF THE DRAWINGS

FIGS. 1A and 1B show an essential part of a first embodiment of a microminiature power converter according to the present invention, in which FIG. 1A is a plan view of a thin film magnetic induction device seen from the first principal plane side (front surface side) and FIG. 1B is a sectional view taken along the line 1B-1B of FIG. 1A.

FIGS. 4A and 4B show the magnetic flux appearing in the embodiment of FIGS. 1A and 1B, in which FIG. 4A is a plan view of the coil and FIG. 4B is a sectional view of an essential part taken along the line 4B-4B of FIG. 4A.

FIGS. 5A and 5B show a structure of an essential part of a second embodiment of a microminiature power converter according to the present invention, in which FIG. 5A is a plan view of a thin film magnetic induction device seen from the first principal plane side and FIG. 5B is a sectional view taken along the line 5B-5B of FIG. 5A.

FIGS. 6A and 6B illustrate another example the second embodiment with a gap with a slit configuration, in which FIG. 6A illustrates details of area XI of FIG. 5A, and FIG. 6B is a sectional view including a part taken along the line 6B-6B of FIG. 6A and corresponds to FIG. 5B.

FIGS. 7A and 7B show a structure of an essential part of a third embodiment of a microminiature power converter according to the present invention, in which FIG. 7A is a plan view of a thin film magnetic induction device seen from the first principal plane side and FIG. 7B is a sectional view taken along the line 7B-7B of FIG. 7A.

FIGS. 8A, 8B, and 8C show a structure of an essential part of a fourth embodiment of a microminiature power converter according to the present invention, in which FIG. 8A is a plan view of a thin film magnetic induction device seen from the first principal plane side, FIG. 8B is a sectional view taken along the line 8B-8B of FIG. 8A, and FIG. 8C is a sectional view taken along the line 8C-8C of FIG. 8A.

FIGS. 11A and 11B show a structure of an essential part of a microminiature power converter of prior art, in which FIG. 11A is a sectional view taken along the line 11A-11A of FIG. 11B, which is a plan view of a thin film magnetic induction device.

DETAILED DESCRIPTION

A microminiature power converter typically includes a semiconductor integrated circuit (hereinafter referred to as an IC) connected a thin magnetic induction device, and includes passive components, such as a coil, a capacitor, and a resistor. The present microminiature power converter incorporates a thin film magnetic induction device having a magnetic insulating substrate and electrodes formed in the peripheral region of the magnetic insulating substrate so that they are collectively arranged at only one side or two opposing sides in the direction parallel to the axis of the solenoid coil. This configuration allows the coil to have a longer length and a higher inductance (an L value). Moreover, by forming a gap or slot in the peripheral region of the magnetic insulating substrate, the outer peripheral magnetic flux running outside the electrodes can be decreased, suppressing the induced voltage that is generated between the opposing front and back electrodes. Since the induced voltage is suppressed low, the microminiature power converter that generates little noise at the electrodes is obtained. Specific embodiment examples will be described hereinafter. Although the description will be referred to specific examples where the electrodes are arranged at two sides, the arrangement of electrodes with a gap formed in the substrate can be applied to the arrangement at one side, three, and four sides.

Figure 1A:
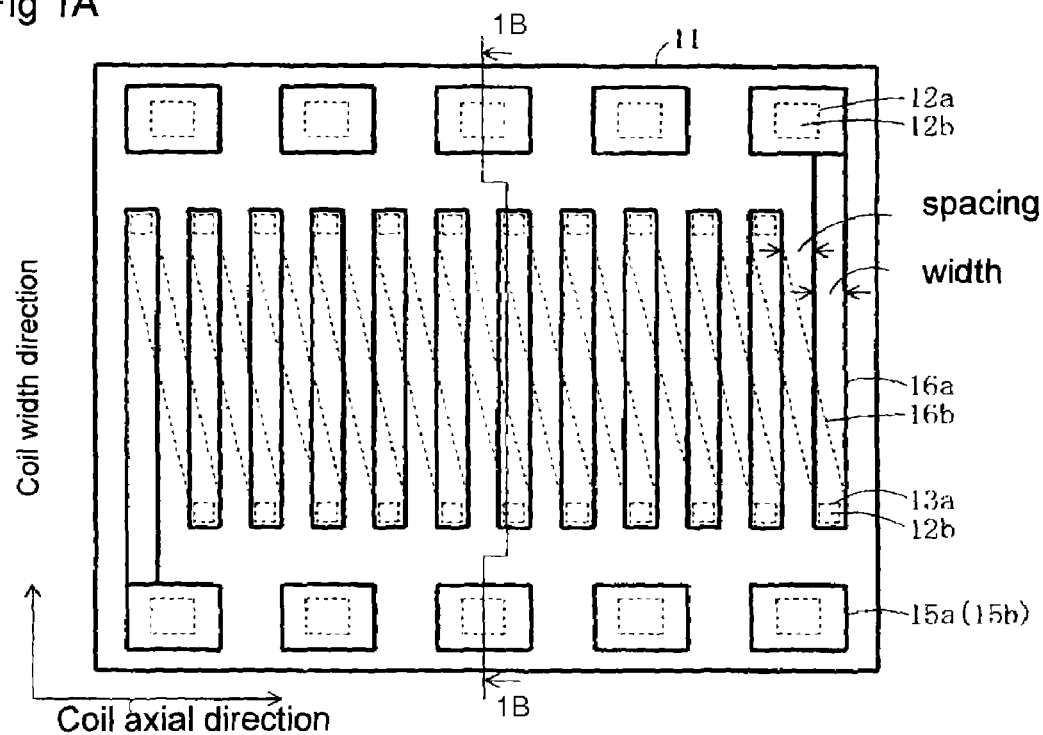
Figure 1B:
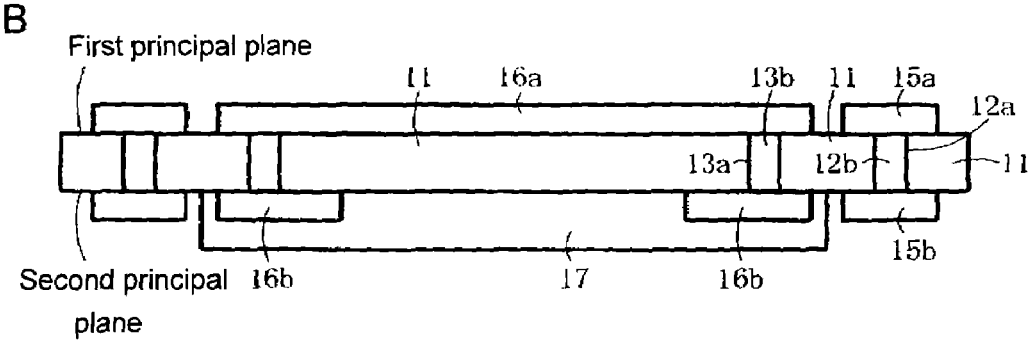

Referring to FIGS. 1A and 1B, although the first embodiment of the microminiature power converter includes an IC chip and other components, as shown in FIG. 11, they are omitted in FIGS. 1A and 1B to show the thin film magnetic induction device. The thin film magnetic induction device comprises a ferrite substrate 11, which is a magnetic insulating substrate, a solenoid coil formed in the inner region of the ferrite substrate 11, pairs of electrodes arranged in the peripheral side region of the ferrite substrate 11 along the direction parallel to the axis of the coil, pairs of electrodes 15a and 15b opposing one another while sandwiching the ferrite substrate 11, and a protective film 17. The solenoid coil includes coil conductors 16a and 16b, and connection conductors 13b that electrically connect the coil conductors 16a and 16b to form a coil configuration. Connection conductors 12b electrically connect the electrodes 15a and 15b. The connection conductors 12b and 13b are provided by forming conductive films on the walls of the through-holes 12a and 13b formed in the magnetic insulating substrate 11.

In the thin film magnetic induction device of the prior art shown in FIG. 11, the electrodes 88 and 82 for packaging the IC chip 80 are arranged (evenly) along four sides (hereinafter referred to as four-side arrangement). Thus, the electrodes 82 and 88 arranged at the sides in the direction parallel to the direction of the coil width (a direction orthogonal to the coil axis) restrict the length of the coil conductor 84 and thus the number of turns of the coil conductors 84.

In the first embodiment shown in FIGS. 1A and 1B, the electrodes that are arranged in the direction of the coil width in the prior art are collectively arranged along the either sides (both upper and lower sides) along the direction parallel to the coil axis (hereinafter referred to as two-side arrangement). Thus, the coil length (length in the direction of coil axis) can be made longer, and the widths of the coil conductors 16a, 16b and the number of turns of the coil can be increased. When a coil is to be formed in the same rule of wiring (the length and film thickness of the coil conductors 16a, 16b, and the series resistance of the coil are the same), the two-side arrangement can increase the number of turns by several turns in comparison with the four-side arrangement. The increased number of turns yet ensures the same series resistance by increasing the width of wiring of the coil conductors 16a, 16b. Thus, the inductance value (an L value) solely can be raised without increasing the series resistance that would degrade the power conversion efficiency.

If the increase in series resistance is not a series problem, the inductance value can be further improved by controlling the width of wiring of the coil conductors. In the case of a small number of electrodes where a one-side arrangement can be taken, the coil width in the direction orthogonal to the coil axis can be extended to increase the cross-sectional area of the coil. Thus, the inductance value can be further raised.

FIGS. 2A-2F illustrate the sectional views of the manufacturing process of the thin film magnetic induction device of the first embodiment corresponding to the sectional view taken along the line 1B-1B of FIG. 1A. While FIGS. 2A-2F illustrate an enlarged portion for one chip, in the actual manufacturing process, however, multiple chips are processed on one substrate.

First, a Ni—Zn ferrite substrate 11 having a thickness of 525 μm was used for a magnetic insulating substrate. The thickness of the substrate is determined from the required inductance, a coil current value, and characteristics of the magnetic substrate, and is not limited to the thickness of this embodiment. Although a ferrite substrate 11 was used for a magnetic insulating substrate, the substrate is not limited to the ferrite substrate and any material of a magnetic insulating substance can be used. The ferrite substrate was used in this embodiment because it is easily moldable into a substrate shape.

Figure 2A:
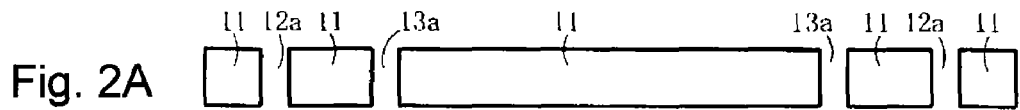
FIGS. 2A-2F show sectional views of an essential part shown in process sequence of a fabrication method of the thin film magnetic induction device of the embodiment of FIGS. 1A and 1B.

Through-holes 12a, 13a are formed in the ferrite substrate 11 as shown in FIG. 2A. The through-hole 12a is for electrically connecting an electrode 15a on the first principal plane and an electrode 15b on the second principal plane. The through-hole 13a is for electrically connecting a coil conductor 16a and a coil conductor 16b. Any machining technique, such as laser machining, sand blast machining, electric discharge machining, ultrasonic machining, and mechanical machining can be used to form the holes, and can be determined considering the machining cost, machining dimensions, and the like. In the first embodiment, the sand blast machining technique was employed since the minimum machining width dimension was as minute as 0.13 mm and many places needed to be machined.

Thereafter, connection conductors 12b, 13b were formed in the through-holes 12a, 13a, and coil conductors 16a, 16b and electrodes 15a, 15b on the first principal plane and the second principal plane of the ferrite substrate 11 were formed. The details for forming them will be described in the following.

Figure 2B:

To impart conductivity to the whole surface, a film of Cr/Cu is deposited by a sputtering method to form a plating seed layer 21 (FIG. 2B). At this time, the conductivity is imparted to the through-holes 12a, 13a as well, which can be carried out by electroless plating, if necessary. In addition to the sputtering method, a vacuum evaporation method, a CVD (chemical vapor deposition) method or the like can be employed. The layer can be formed solely by an electroless plating method. Any method that can provide sufficient adhesiveness to the substrate can be used. Any conductive material can be used as long as it exhibits appropriate electric conductivity. Although chromium was used for the adhesive layer to obtain adhesiveness in the first embodiment, Ti, W, Nb, Ta or the like can be used as well. Although copper was used for the seed layer on which a plating layer was formed in the subsequent electroplating process, nickel or gold can be used as well. In the first embodiment, the film composition of Cr/Cu was used in view of ease of machining in the subsequent process.

Figure 2C:
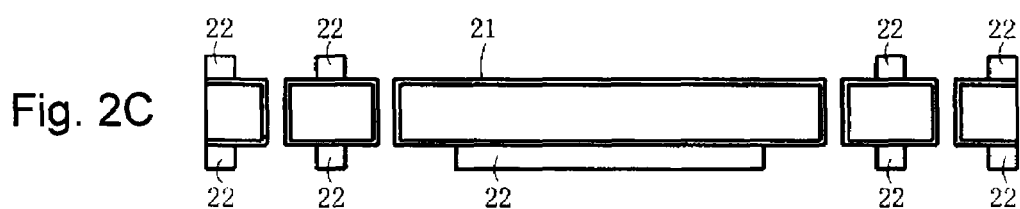
Figure 2D:
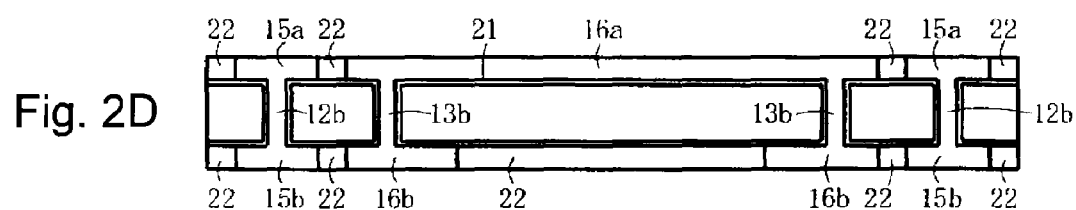
Figure 2E:
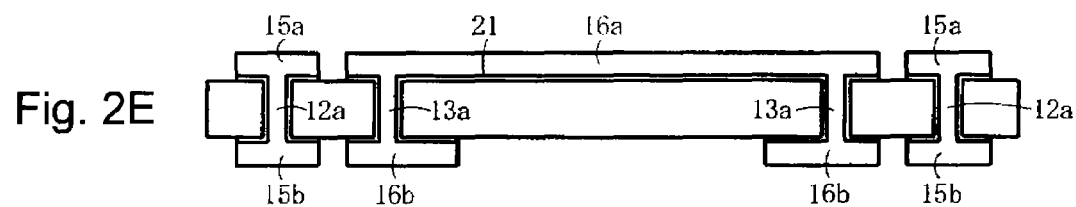
Figure 2F:
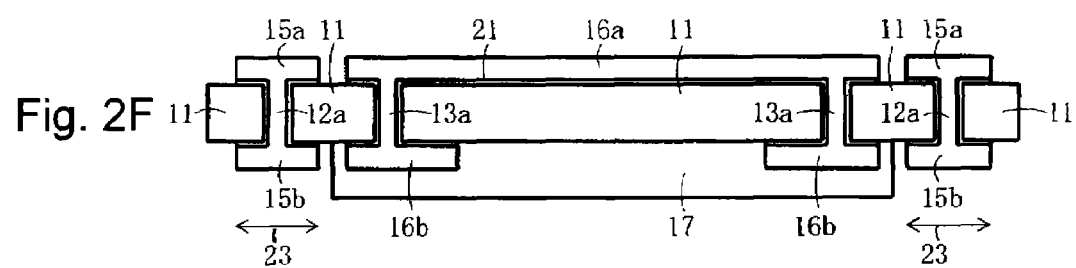

Then, a pattern for forming coil conductors 16a, 16b and electrodes 15a, 15b on the first and second principal planes is formed using photoresist 22 (FIG. 2C). In the first embodiment, a negative film type resist was used for forming the pattern. Then, a copper layer is electroplated to form the coil conductors 16a, 16b and the electrodes 15a, 15b at the exposed areas of the resist pattern (FIG. 2D). The copper is also plated in the through-holes 12a, 13a in this process. This plating forms connection conductors 12b, 13b to connect the coil conductors 16a and 16b on the first and second principal planes, and the electrodes 15a and 15b on the first and second principal planes. This plating process also forms the solenoid-shaped coil configuration 16a, 16b and the electrodes 15a, 15b at the same time. After the electroplating, unnecessary photoresist 22 and plating seed layer 21 (a conductive layer) are removed to obtain the desired coil conductors 16a, 16b and electrodes 15a, 15b (FIG. 2E). Then, a protective film 17 is formed on one side of the substrate, here on the coil conductor 16b (FIG. 2F).

In the first embodiment, a photosensitive insulating material of a film type was used for the photoresist 22. The protective film 17 protects the coil conductor 16b on the second principal plane against the atmosphere containing moisture and the like. The photoresist 22 and the protective film 17 work to fill the internal cavity of the through-holes 12a, 13a and make irregularities even. To thoroughly fill the depression generated between the coil conductors 16a, 16b, which have a complicated irregular structure, with the protective film 17, and to fill the internal space of the through-holes 12a, 13a without leaving any void, a vacuum lamination method was used.

Since the protective film 17 is photosensitive, the exposure and development were conducted as for the usual photoresist to form openings 23 for electrodes at the same time. The photosensitive insulating material used, which was of a thermosetting type, was thermally cured at 180° C. after the photochemical machining. A formation method of the insulating film 17 is not limited to the film type material, but a liquid type insulating material can be patterned by screen printing and thermally cured. Although the insulating film and the protective film are not formed on the first principal plane in this embodiment, they can be formed if necessary.

Figure 11A:
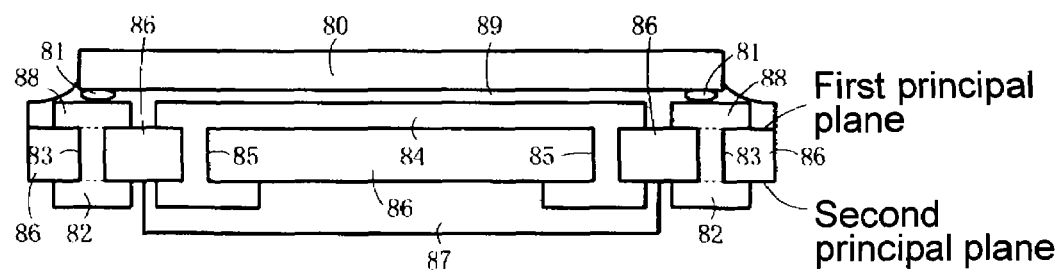

Thus, a thin film magnetic induction device has been fabricated through the process describe above. After that, as shown in FIG. 11A, a semiconductor element (an IC chip 80, for example) can be connected by an ultrasonic bonding method using a stud bump 81, and the space between the IC chip 80 and the thin film magnetic induction device is filled and sealed with a fill resin 89. Although the connection was carried out using the stud bump 81 and ultrasonic bonding in this embodiment, the connection method is not limited to this technique, and solder bonding and a conductive bonding material can be used without any problem. A wire bonding method, which is not a planar packaging method, instead can be employed.

Although the fill resin 89 was used to fill the gap between the IC chip and the thin film magnetic induction device, the material can be selected according to the requirement, and a sealing material such as an epoxy resin also can be used.

Figure 3:
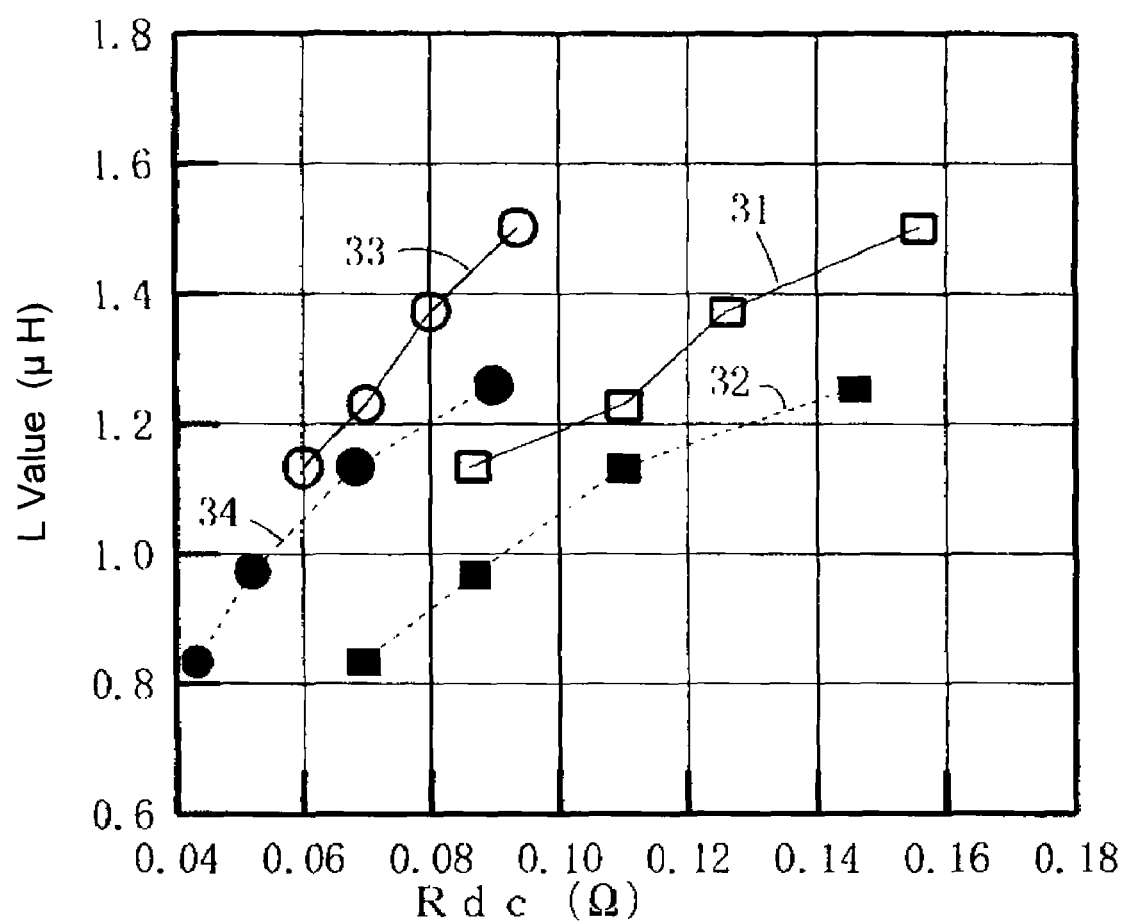
FIG. 3 shows the relationship between the DC resistance (Rdc) and the inductance value (L value).

FIG. 3 shows the relationship between the DC resistance (Rdc) and the inductance value (L value) for the present device and the conventional structure, with the same rule of wiring. All these examples use a thin film magnetic induction device having external dimensions (of the ferrite substrate) of 3.0 mm×3.0 mm. Of the examples with the coil conductors 16a, 16b having a film thickness of 35 μm, the reference numeral 31 designates a characteristic of a thin film magnetic induction device of the present device (with the two-side arrangement), and the reference numeral 32 designates the conventional device with the four-side arrangement. Of the examples with the coil conductors 16a, 16b having a film thickness of 60 μm, the reference numeral 33 designates a characteristic of a thin film magnetic induction device of the present device with the two-side arrangement, and the reference numeral 34 designates the conventional device with the four-side arrangement. The inductance values are typical ones measured at a frequency of 2 MHz, supplying DC current of 300 mA. The maximum widths of coil conductors in the both structures were equal.

FIG. 3 demonstrates that the two-side arrangement can form a structure that exhibits a larger inductance value (at the same DC resistance) than the four-side arrangement when the both structures are formed according to the same design rule (the same dimensional accuracy). This means that the performance of an inductor is improved employing the same level of manufacturing technology. As a result, the performance of a power converter is improved, including enhancement of conversion efficiency.

Figure 4A:
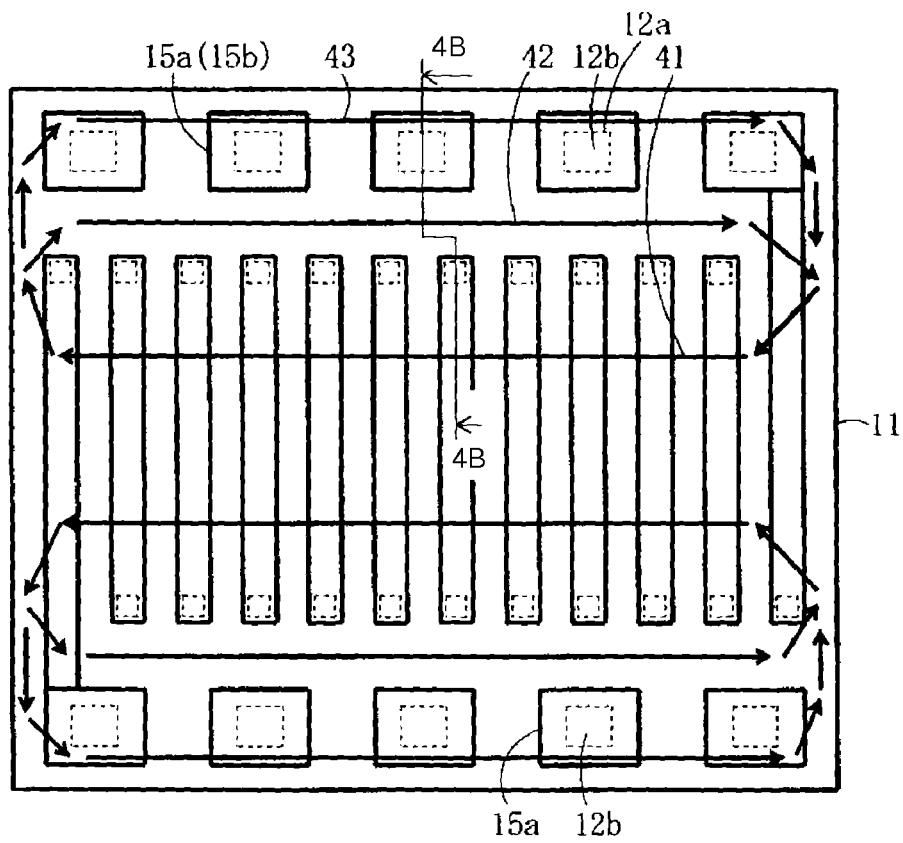
Figure 4B:
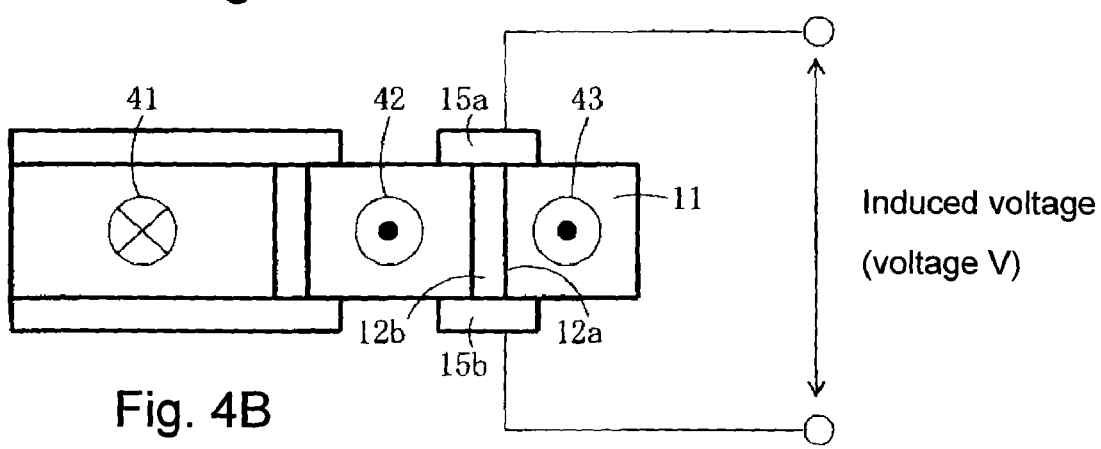

FIG. 4A shows the magnetic flux in the first embodiment. The arrows 41, 42, 43 indicate the magnetic flux running in the main magnetic path and schematically illustrate the flow of magnetic flux generated by the coil. On supplying current in the coil, the magnetic flux 41 flows in the main magnetic path beneath the coil conductors (inside the coil). The magnetic flux 42, 43 flow in the peripheral region of the coil that is a return magnetic path. This flux is called a return magnetic flux. The return magnetic flux (the magnetic flux 42, 43) divides into a magnetic flux 42 (referred to here as an inner peripheral magnetic flux) that flows inside the region of the through-holes 12a (connection conductors 12b) formed at the electrode 15a, 15b, and a magnetic flux 43 (referred to here as an outer peripheral magnetic flux) that flows outside the region of the through-holes 12a (the connection conductors 12b). Although no important problem arises on the characteristic as an inductor (a thin film magnetic induction device), when a power converter is fabricated and electric current is supplied to the coil, the outer peripheral magnetic flux 43 can generate an induced voltage (that is, a noise) between the electrode 15a and the electrode 15b depending on the configuration of packaged components. As is apparent from the sectional view, a magnetic substance is present around the electrodes 15a, 15b and the outer peripheral magnetic flux flows, which can cause generation of induced voltage between the electrode 15a and the electrode 15b. This induced voltage, under a condition of fixed frequency and supplied current, varies in proportion to the amount of magnetic flux in the ferrite substrate. Some techniques for reducing the outer peripheral magnetic flux 43 are described with reference to the additional embodiment examples.

Figure 5A:
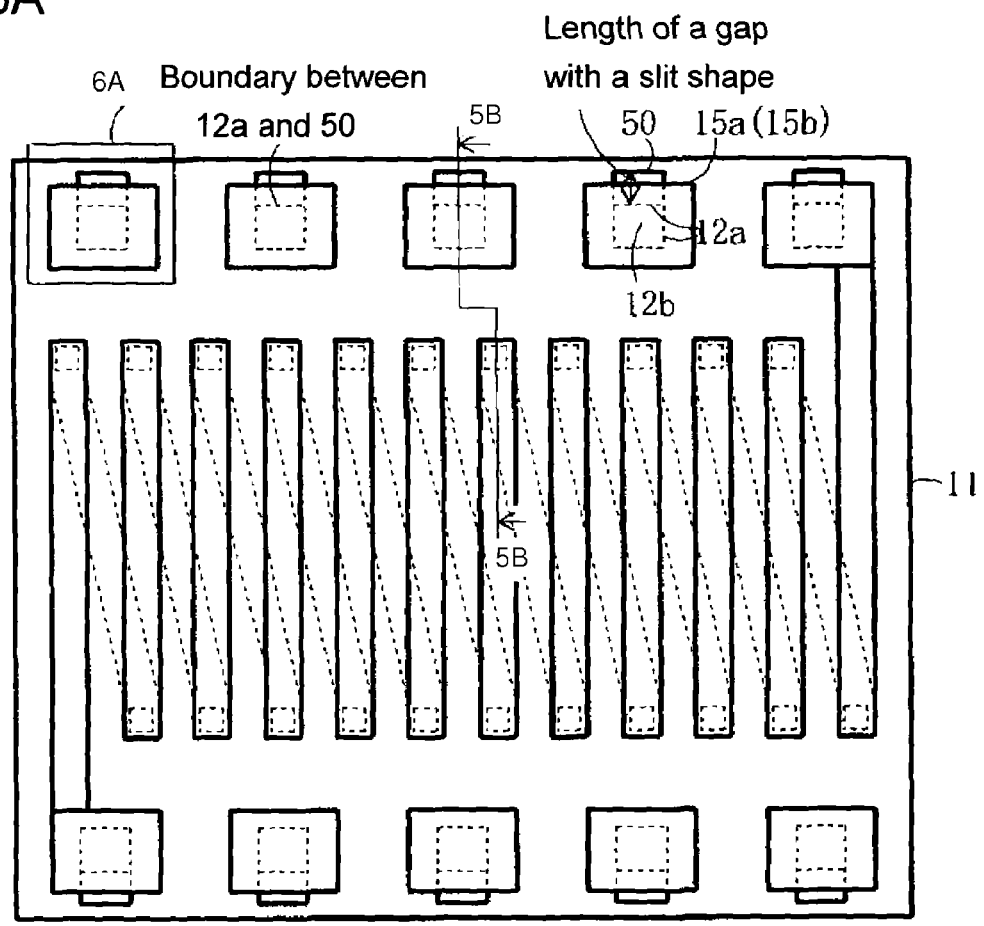
Figure 5B:
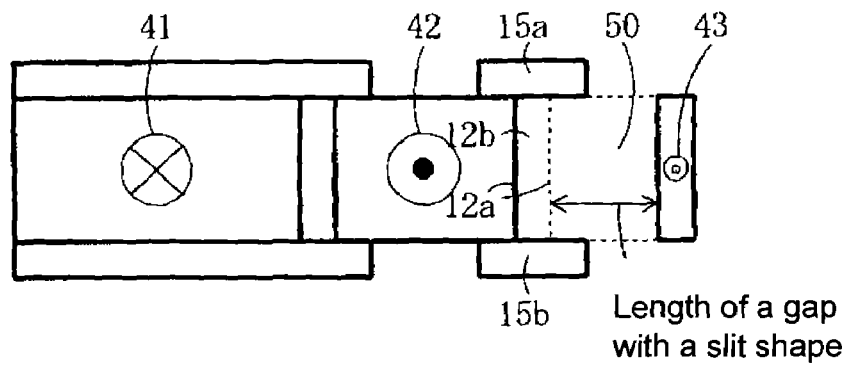

FIGS. 5A and 5B show the second embodiment of the microminiature power converter. In the second embodiment, a gap 50 in the configuration of a slit is provided through the ferrite substrate 11 in continuation from the through-hole 12a that connects the electrode 15a on the first principal plane and the electrode 15b on the second principal plane, the electrodes 15a and 15b being connected electrically by a connection conductor 12b. Provision of the gap 50 with the slit reduces the width of the ferrite substrate 11 outside the electrodes 15a, 15b, thereby reducing the outer peripheral magnetic flux 43 flowing outside the electrodes 15a, 15b. When the through-hole 12a and the gap 50 of a slit shape are formed at the same time, a planar shape of the combined structure can become an ellipse with a major axis thereof directing to the outer end of the ferrite substrate 11. In that case, a gap 50 with a slit shape is the portion of the ellipse in the major axis direction nearer to the outer end of the ferrite substrate 11. This ellipse is represented by a rectangle for convenience in FIG. 5A.

Figure 6A:
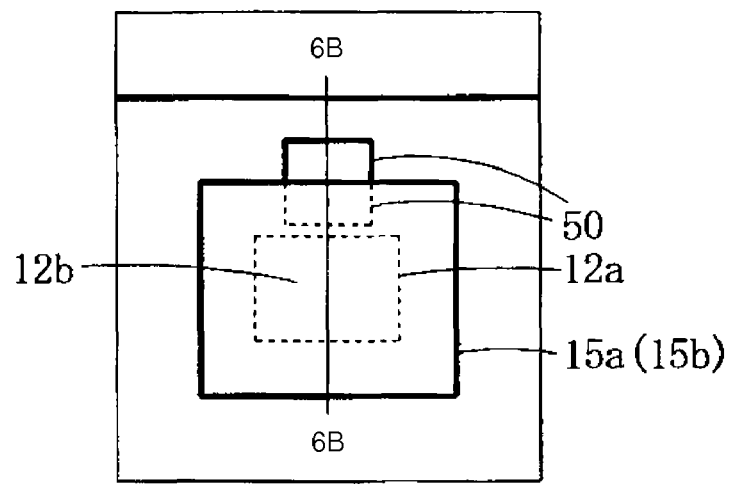
Figure 6B:
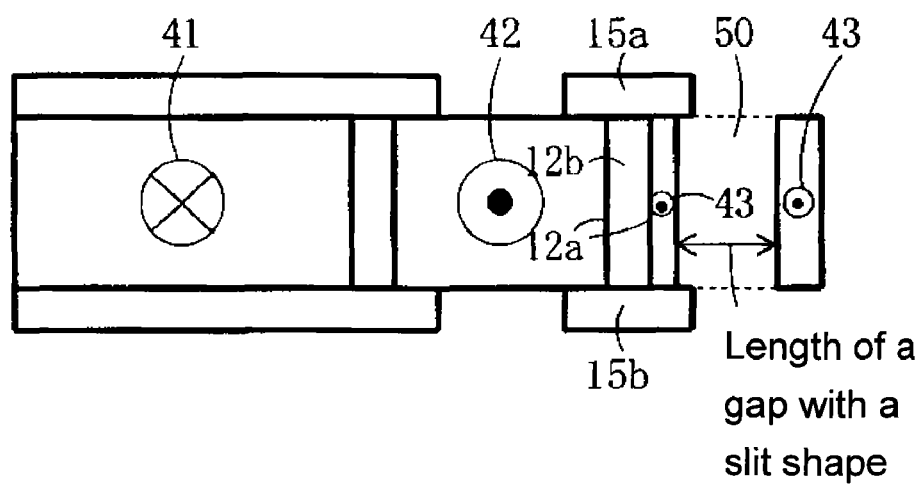

The gap 50 with a slit shape can be formed in separation (spaced) from the through-hole 12a as shown in FIGS. 6A and 6B. In that case too, the outer peripheral magnetic flux 43 is reduced. In this case, however, a part of the ferrite substrate 11 remains between the through-hole 12a and the gap 50 with a slit shape. Accordingly, the reduction rate of the outer peripheral magnetic flux 43 is smaller than in the case of the embodiment of FIGS. 5A and 5B.

To fabricate a structure of according to the second embodiment, only the patterning step (FIG. 2A) of forming the through-holes in the ferrite substrate 11 in the steps (FIGS. 2A-2F) in fabricating the magnetic induction device of the first embodiment needs to be changed. As a result, the connection conductor is also formed on the wall of the gap 50 with a slit shape. However, it does not adversely affect the advantage of the second embodiment. Although the electrodes 15a, 15b are positioned inside apart from the outer end of ferrite substrate 11, the electrodes 15a, 15b extending to the outer end of the ferrite substrate 11 do not have adverse effect on the advantage of the second embodiment, providing the same benefits.

Figure 7A:
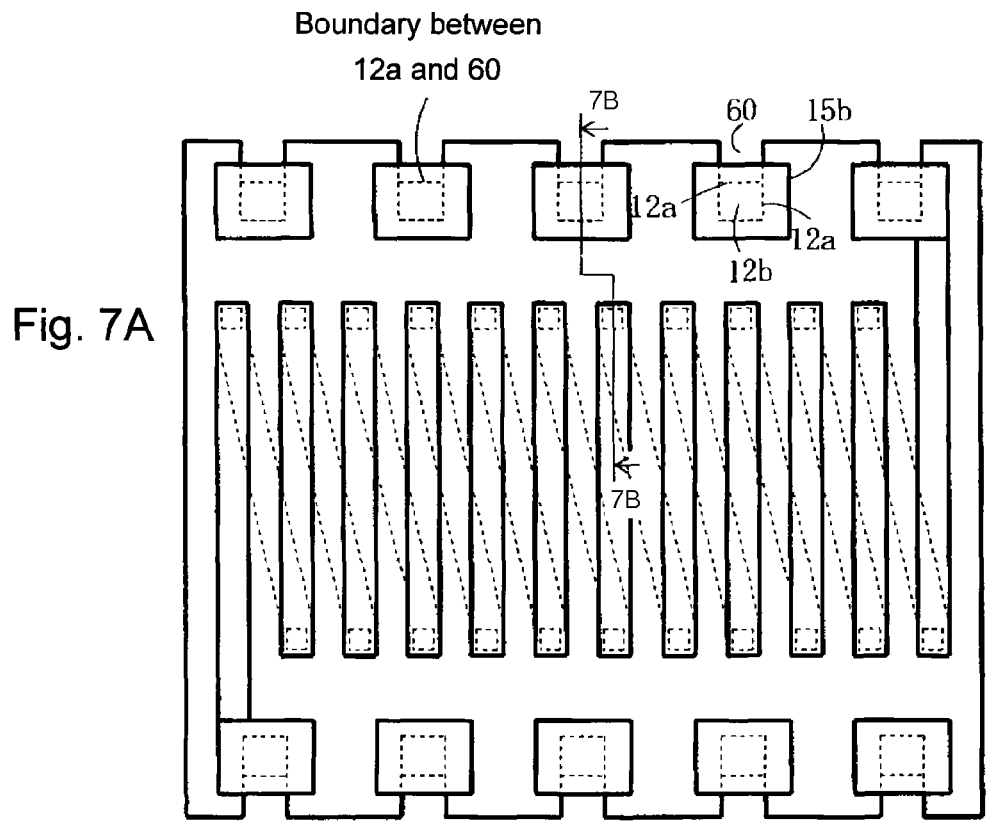
Figure 7B:
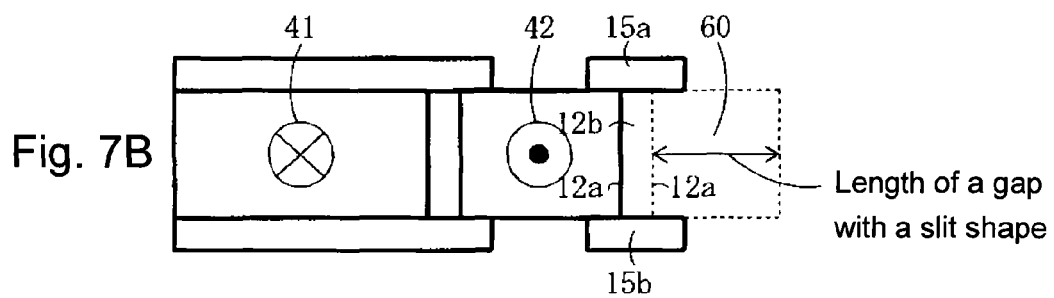

FIGS. 7A and 7B show the third embodiment of a microminiature power converter. Here, the gap 60 is configured differently from the gap 50 of the second embodiment. Specifically, the slits extend from the through-hole 12a to the outer peripheral end of the ferrite substrate 11, thereby forming a slot that intercepts an outer peripheral magnetic flux 43. The gap 60 with a slit shape completely passes through the ferrite substrate.

Since the portion of the ferrite substrate outside the electrodes 15a, 15b is completely removed, an outer peripheral magnetic flux 43 flowing in the peripheral region outside the electrodes 15a, 15b is completely eliminated. A small amount of leakage flux, however, is present and a very small induced voltage appears (less than about 1%). To fabricate the gap in the third embodiment, similar to the fabrication of the second embodiment, only the patterning step (FIG. 2A) of forming the through-holes in the ferrite substrate 11 in the fabrication steps (FIGS. 2A-2F) needs to be changed.

In the alternative embodiment of FIGS. 6A and 6B, the electrodes 15a, 15b are drawn inwardly from the outer peripheral end. However, as provided in the third embodiment, the electrodes 15a, 15b can extend to the outer peripheral end without negating the advantages.

Figure 8A:
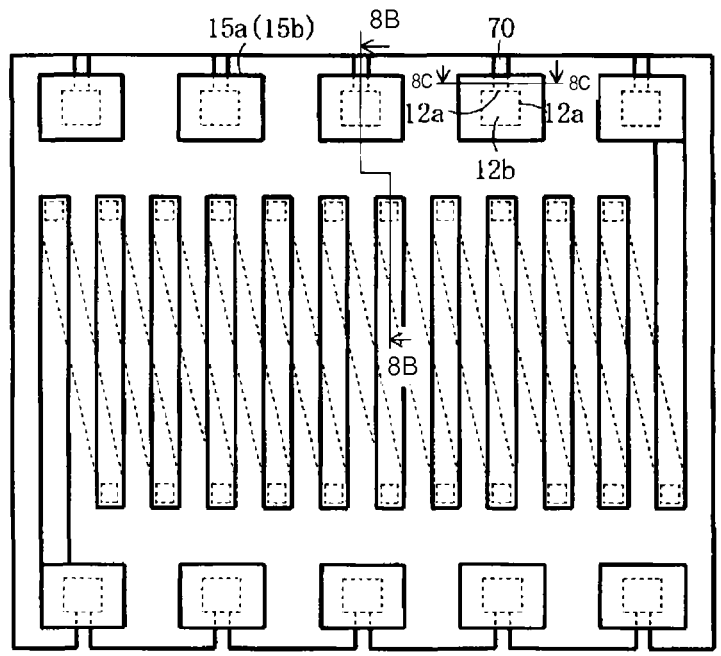
Figure 8B:
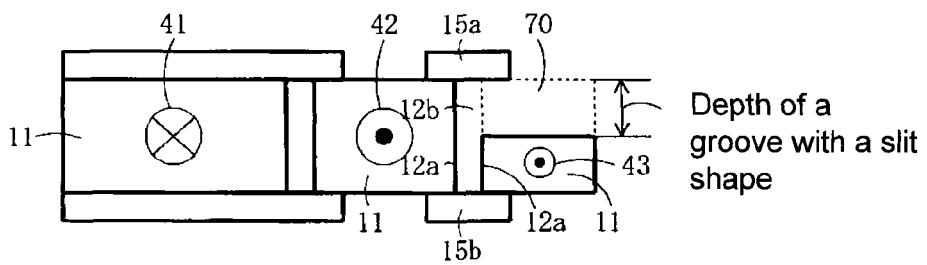
Figure 8C:
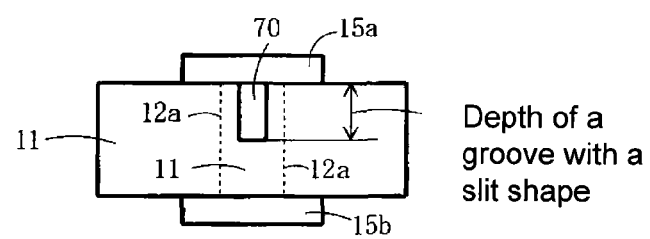

FIGS. 8A, 8B, 8C show the fourth embodiment of a microminiature power converter. In the fourth embodiment, a groove 70 with a slit shape that does not pass throughout the ferrite substrate 11 extends from the through-hole 12a connecting the electrode 15a on the first principal plane and the electrode 15b on the second principal plane to the outer peripheral end of the substrate. Thus, part of the ferrite substrate 11 outside the electrodes 15a, 15b is decreased, thereby reducing the outer peripheral magnetic flux 43 flowing outside the electrodes 15a, 15b. To fabricate the fourth embodiment, again, only the patterning step (FIG. 2A) of forming the through-holes in the ferrite substrate in the steps (FIGS. 2A-2F) of fabricating a magnetic induction device needs to be changed.

In the fourth embodiment, the electrodes 15a, 15b are drawn inwardly from the outer peripheral end. However, the electrodes 15a, 15b also can extend to the outer peripheral end without negating the advantages gained by the present configuration. The groove 70 with a slit shape is formed directly from the through-hole 12a to the outer periphery in the fourth embodiment. However, the groove 70 with a slit shape need not be formed directly from the through-hole 12a but can be formed from the close vicinity of the through-hole 12a. When part of the ferrite substrate 11 exists between the through-hole 12a and the groove with a slit shape, the outer peripheral magnetic flux 43 increases at that place, increasing an induced voltage a little.

Figure 9:
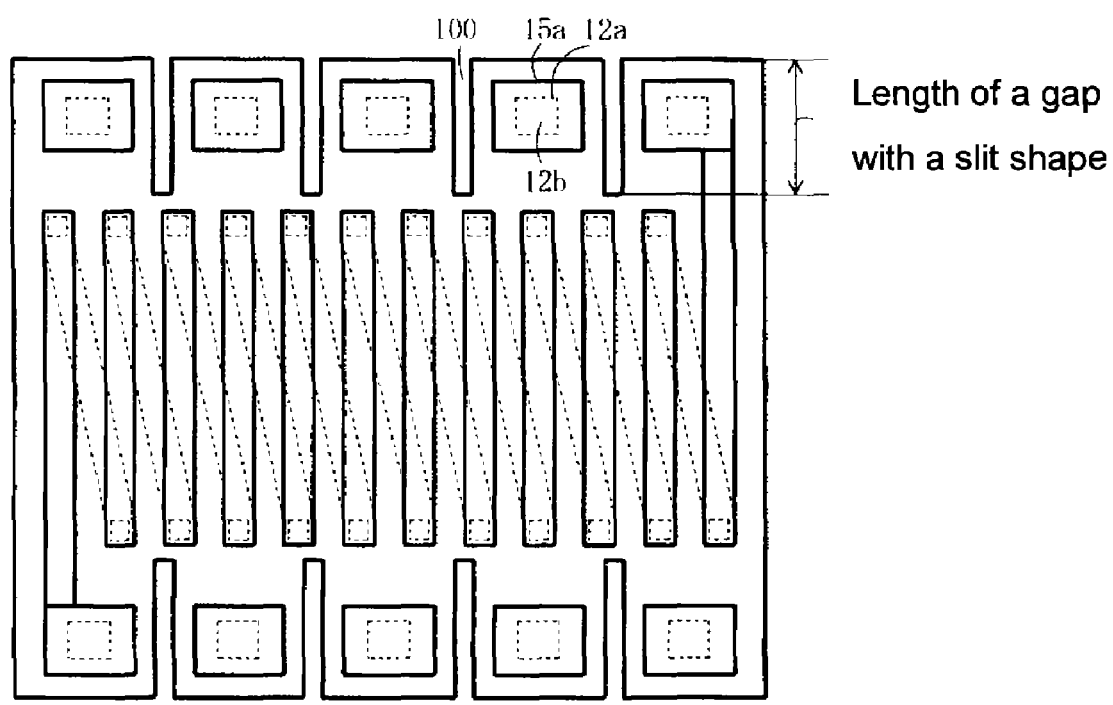
FIG. 9 is a plane view of a thin film magnetic induction device seen from the first principal plane side of an essential part of a fifth embodiment of a microminiature power converter according to the present invention.

FIG. 9 shows a fifth embodiment of a microminiature power converter. Here, a gap 100 having a slit shape and passing throughout the ferrite substrate is formed between the through-hole 12a connecting the electrode 15a on the first principal plane and the electrode 15b on the second principal plane and the adjacent electrode 12a for the next electrode pair. The gap 100 increases the magnetic resistance and reduces the outer peripheral magnetic flux 43 flowing outside the electrodes 15a, 15b. In this structure, the gap 100 with a slit shape preferably reaches the outer peripheral end and passes throughout the ferrite substrate 11. The gap 100 has a poor effect if it does not reach the outer peripheral end like the gap 50 with a slit shape of the second embodiment, or if the gap 100 does not pass throughout the ferrite substrate 11 like the groove 70 with a slit shape of the fourth embodiment.

In the fifth embodiment, the distance between the through-hole 12a and the gap 100 with a slit shape exerts influence on the effect to reduce the outer peripheral magnetic flux 43. Although the fifth embodiment has a smaller effect than the second-fourth embodiments, it is still effective in the case where the gaps 50 and 60 and the groove 70 with a slit shape are very hard to be formed, and a gap 100 with a slit shape is formed by post machining.

In the second-fourth embodiments, the gaps 50 and 60 and the groove 70 with a slit shape are formed at every pair of electrodes 15a, 15b. However, it is also possible to form the gaps and the grooves solely at the electrodes connecting to signal lines of an IC, which is vulnerable to be influenced by the induced voltage, and not at the electrodes connecting to a power supply, which is scarcely influenced by the induced voltage. This way, the volume occupied by the gaps 50 and 60 and the grooves 70 with a slit shape is reduced, resulting in a raised L value.

Figure 10:
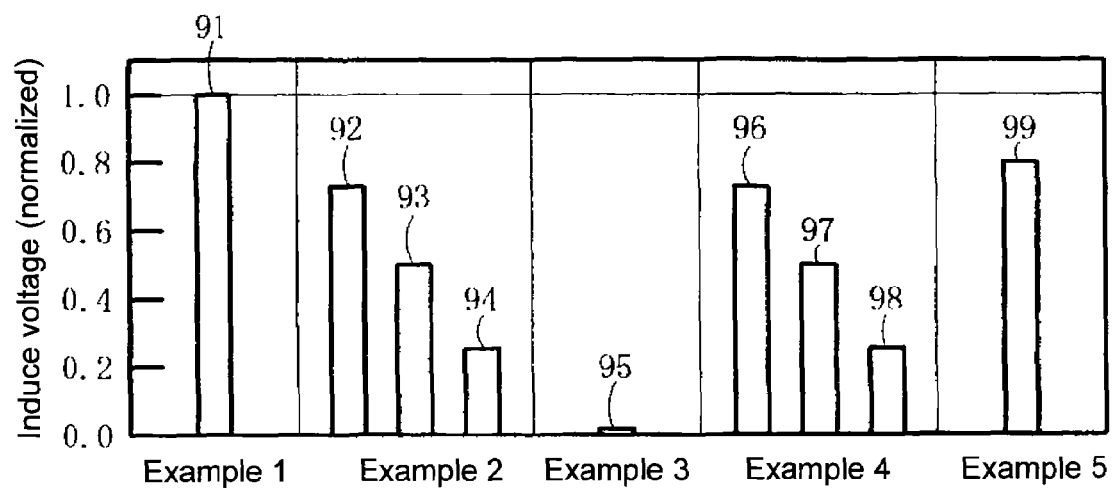
FIG. 10 shows induced voltages generated in the electrodes of the first to fifth embodiments.

FIG. 10 shows the induced voltages generated at the electrodes in the first-fifth embodiments for comparison. The induced voltage varies with the conditions of supplied current, frequency, and a distance from the through-hole to the outer peripheral end. The comparison of FIG. 10 was made in the conditions of 3.0 mm square, number of turns of 12, amplitude of AC current of 0.6 A, frequency of 2 MHz, and a distance from the edge of the through-hole 12a to the outer peripheral end of 200 µm. The induced voltages are given in normalized values. In FIG. 10, numeral 91 indicates the induced voltage in the first embodiment, which has no gap, numerals 92, 93, 94 indicate the induced voltages in the second embodiment, in which the length of the gap with a slit shape are varied, numeral 95 indicates the induced voltage in the third embodiment, in which the gap with a slit shape reaches the outer peripheral end of the ferrite substrate, numerals 96, 97, 98 indicate the induced voltages in the fourth example, in which the depth of the groove with a slit shape are varied, and numeral 99 indicates the induced voltage in the fifth example, in which the length of the gap with a slit shape was 400 µm.

Any of the second through fourth embodiments can reduce the induced voltage generated between the electrode 15a and the electrode 15b, and an available structure can be selected considering conditions of manufacturing processes and structures. The structure of the third embodiment in particular generates very little induced voltage and has a very large effect. A degradation of the L value in the third embodiment is very small about 4% as compared with the first embodiment, which does not have a gap with a slit shape. The degradations of L values were still smaller in other embodiment embodiments, namely the second, fourth, and fifth embodiments.

Figure 11B:
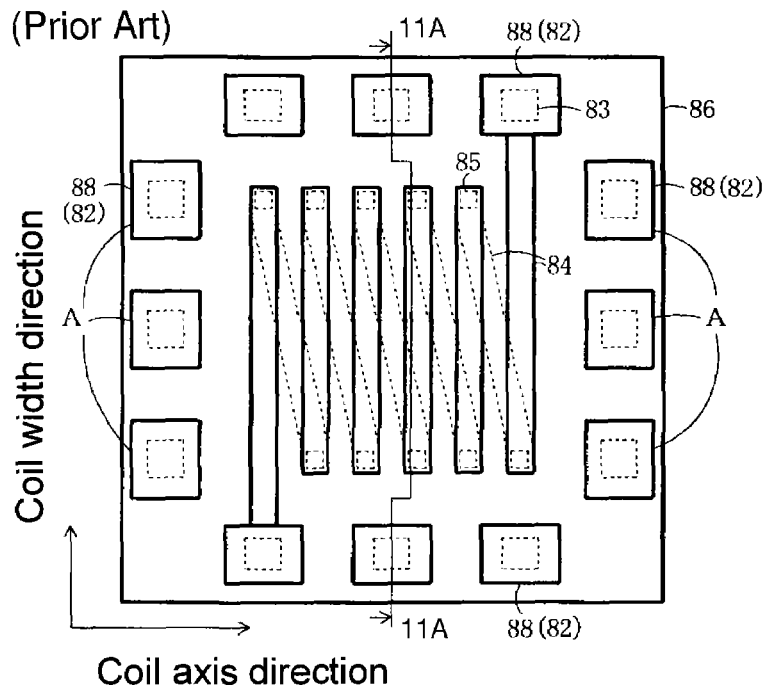

Any combination of the first-fifth embodiments of course possible. The effect obtained by providing the gap with a slit shape is not limited to the two-side arrangement of electrodes shown in the first-fifth embodiment, but can be applied to the three- or four-side arrangement of electrodes, such as illustrated in FIGS. 11A and 11B.

The present configuration allows an increased coil length to increase the number of turns, thereby raising the inductance value of the coil. The inductance value can be increased without increase in a series resistance of the coil, which would adversely affect the power conversion efficiency. A microminiature power converter according to the invention can enhance performance so that the size can be reduced. When a gap is formed in the peripheral region of the magnetic insulating substrate, the outside peripheral magnetic flux running outside the electrodes is decreased, reducing induced voltage at the electrodes. Thus, a microminiature power converter that generates little noise at the electrodes can be provided. When the gap is formed to extend from the through hole to the outer peripheral end of the magnetic insulating substrate, the induced voltage at the electrode is suppressed to a negligibly small value, yet ensuring approximately equal inductance value to the case without a gap.

While the present invention has been particularly shown and described with reference to particular embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Patent Application No. 2006-330786, filed on Dec. 7, 2006. The disclosure of the priority application, in its entirety, including the drawings, claims, and the specification thereof, is incorporated herein by reference.

What is claimed is:

1. A microminiature power converter comprising:
a semiconductor device having an integrated circuit; and
a thin film magnetic induction device operatively connected to the semiconductor device,
wherein the thin film magnetic induction device includes:
a magnetic insulating substrate having a first principal plane and a second principal plane, a plurality of first through-holes, and a plurality of second through-holes;
a solenoid coil comprising a conductor extending on the first principal plane of the magnetic insulating substrate, passing through the through holes and extending on the second principal plane of the magnetic insulating substrate to form a coil configuration;
second connection conductors in the second through-holes; and
a plurality of pairs of electrodes connected through the second connection conductors and formed opposing each other on the first principal plane and the second principal plane,
wherein the second through-holes are situated along a peripheral region of the magnetic insulating substrate,
wherein the pairs of electrodes are arranged collectively only at one side or two opposing sides of the magnetic insulating substrate, extending parallel to an axis of the solenoid coil.

2. The microminiature power converter according to claim 1, wherein the magnetic insulating substrate has at least one of gaps or grooves around the peripheral region thereof to reduce induced voltage between the pairs of electrodes.

3. The microminiature power converter according to claim 2, wherein the gaps extend from the second through-holes or are spaced from the second through-holes.

4. The microminiature power converter according to claim 2, wherein each of the gaps has a slit configuration passing through the magnetic insulating substrate.

5. The microminiature power converter according to claim 2, wherein the grooves extend between adjacent pairs of the electrodes on the first or second principal plane.

6. The microminiature power converter according to claim 2, wherein the grooves extend from at least one the first or the second principal plane toward but not to the other of the first or second plane.

7. The microminiature power converter according to claim 2, wherein the gaps or grooves reach an outer peripheral end of the magnetic insulating substrate.

8. A microminiature power converter comprising:
a semiconductor device having an integrated circuit; and
a thin film magnetic induction device operatively connected to the semiconductor device,
wherein the thin film magnetic induction device includes:
a magnetic insulating substrate having a first principal plane and a second principal plane, a plurality of first through-holes, and a plurality of second through-holes;
a solenoid coil comprising a conductor extending on the first principal plane of the magnetic insulating substrate, passing through the through holes and extending on the second principal plane of the magnetic insulating substrate to form a coil configuration;
second connection conductors in the second through-holes; and
a plurality of pairs of electrodes connected through the second connection conductors and formed opposing each other on the first principal plane and the second principal plane,
wherein the second through-holes are situated along a peripheral region of the magnetic insulating substrate,
wherein the magnetic insulating substrate has at least one of gaps or grooves around the peripheral region thereof to reduce induced voltage between the pairs of electrodes.

9. The microminiature power converter according to claim 8, wherein the gaps extend from the second through-holes or are spaced from the second through-holes.

10. The microminiature power converter according to claim 8, wherein each of the gaps has a slit configuration passing through the magnetic insulating substrate.

11. The microminiature power converter according to claim 8, wherein the grooves extend between adjacent pairs of the electrodes on the first or second principal plane.

12. The microminiature power converter according to claim 8, wherein the grooves extend from at least one the first or the second principal plane toward but not to the other of the first or second plane.

13. The microminiature power converter according to claim 8, wherein the gaps or grooves reach an outer peripheral end of the magnetic insulating substrate.

14. A thin film magnetic induction device for a microminiature power converter, the induction device comprising:
- a magnetic insulating substrate having a first principal plane and a second principal plane, a plurality of first through-holes, and a plurality of second through-holes;
- a solenoid coil comprising a conductor extending on the first principal plane of the magnetic insulating substrate, passing through the through holes and extending on the second principal plane of the magnetic insulating substrate to form a coil configuration;
- second connection conductors in the second through-holes; and
- a plurality of pairs of electrodes connected through the second connection conductors and formed opposing each other on the first principal plane and the second principal plane,
- wherein the second through-holes are situated along a peripheral region of the magnetic insulating substrate,
- wherein the pairs of electrodes are arranged collectively only at one side or two opposing sides of the magnetic insulating substrate, extending parallel to an axis of the solenoid coil.

15. The thin film magnetic induction device according to claim 14, wherein the magnetic insulating substrate has at least one of gaps or grooves around the peripheral region thereof to reduce induced voltage between the pairs of electrodes.

16. The thin film magnetic induction device according to claim 15, wherein the gaps extend from the second through-holes or are spaced from the second through-holes.

17. The thin film magnetic induction device according to claim 15, wherein each of the gaps has a slit configuration passing through the magnetic insulating substrate.

18. The thin film magnetic induction device according to claim 15, wherein the grooves extend between adjacent pairs of the electrodes on the first or second principal plane.

19. The thin film magnetic induction device according to claim 15, wherein the grooves extend from at least one the first or the second principal plane toward but not to the other of the first or second plane.

20. The thin film magnetic induction device according to claim 15, wherein the gaps or grooves reach an outer peripheral end of the magnetic insulating substrate.

\* \* \* \* \*